United States Patent [19]

McCann

[11] Patent Number: 4,916,698
[45] Date of Patent: Apr. 10, 1990

[54] FAILURE DETECTION MECHANISM FOR MICROCONTROLLER BASED CONTROL SYSTEM

[75] Inventor: Gerard O. McCann, Amherst, Ohio

[73] Assignee: Allied-Signal Inc., Morristown, N.J.

[21] Appl. No.: 250,807

[22] Filed: Sep. 29, 1988

[51] Int. Cl.⁴ .............................................. G06F 11/00
[52] U.S. Cl. .................................. 371/16.3; 364/900; 364/426.01
[58] Field of Search ................ 371/62, 12, 16.4, 16.3; 364/184, 431.11, 426.01, 900 MS File; 361/90, 91, 92; 324/78 F, 78 J

[56] References Cited

U.S. PATENT DOCUMENTS

| | | | |
|---|---|---|---|
| 4,317,167 | 2/1982 | Hartig et al. | 364/185 |
| 4,439,805 | 3/1984 | Tarleton | 324/184 X |
| 4,485,448 | 11/1984 | Kurth | 324/78 F |
| 4,528,629 | 7/1985 | Breitling | 371/62 X |
| 4,538,273 | 8/1985 | Lasser | 371/62 |
| 4,541,050 | 9/1985 | Honda et al. | 364/431.11 X |
| 4,562,528 | 12/1985 | Baba | 364/187 X |
| 4,583,198 | 4/1986 | Tomisawa | 364/900 |
| 4,586,179 | 4/1986 | Sirazi et al. | 371/12 |
| 4,587,655 | 5/1986 | Hirao et al. | 371/12 |
| 4,618,953 | 10/1986 | Daniels et al. | 371/12 |
| 4,685,052 | 8/1987 | Sanders | 364/426.01 |
| 4,700,304 | 10/1987 | Byrne et al. | 364/426 |

FOREIGN PATENT DOCUMENTS 0090134 10/1983 European Pat. Off. .
3447449 7/1985 Fed. Rep. of Germany .
2152714 8/1985 United Kingdom .

Primary Examiner—Charles E. Atkinson
Assistant Examiner—Robert W. Beausoliel
Attorney, Agent, or Firm—Ken C. Decker; William N. Antonis

[57] ABSTRACT

A control system includes a microcontroller which receives input signals from input sensors and transmits output signals to electrically actuated solenoid valves in response to the input signals. A drive circuit controller is responsive to the output signals and to a solenoid enable signal generated by a watchdog circuit to control the solenoid valves. The watchdog circuit is responsive to watchdog pulses generated by the microcontroller and transmitted through the watchdog port of the microcontroller to generate the solenoid enable signal. The watchdog circuit generates the solenoid enable signal only when the frequency of the pulses generated at the watchdog port is within a relatively narrow frequency range. Accordingly, the watchdog circuit disables the drive circuits during failure of the microcontroller to assure that the solenoids will not be operated.

16 Claims, 3 Drawing Sheets

FAILURE DETECTION MECHANISM FOR MICROCONTROLLER BASED CONTROL SYSTEM

This invention relates to a failure detection mechanism which inhibits control of electrically actuated mechanisms during malfunction of a microcontroller normally used to control such mechanisms.

Microcontrollers have been increasingly used in recent years in various control systems, particularly those used on motor vehicles. For example, such microcontroller based control systems have been used to control the fuel management system and the braking system of automotive vehicles. When such devices are used to control the braking systems, such as vehicle anti-lock or adaptive braking systems, care must be taken that the solenoid valves which control communication of braking pressure to the brakes of the vehicle are not in a condition permitting decay of braking pressure during a system malfunction. It is a requirement of such systems that, in a case of a malfunction, that the system, at most, reverts to normal braking, that is, braking that would be available in the total absence of such an adaptive braking system. Such adaptive braking systems include wheel speed sensors, which respond to rotation of one or more of the vehicle's wheels in order to supply a signal which varies as the speed of the wheel varies, an electrically actuated control valve, which controls communication of braking pressure to the brakes of the vehicle, and a microcontroller which processes the wheel speed signals and generates output signals controlling the control valve in response to the input signals. The control valve includes one or more electrically activated solenoids.

Although the most common failure of such systems is a defective sensor or solenoid, failures of the microcontroller do occur. As discussed above, it is a requirement that in the case of any single failure, the system functions as it would function without the electronic control. Accordingly, the microcontroller has been provided with a so called "watchdog" port, which, during normal operation of the microcontroller, is provided with a signal that pulsates at a predetermined frequency. Theoretically, in case of failure of a microcontroller, the pulses at the watchdog port are discontinued. This watchdog signal is used in the prior art to disable the microcontroller. However, certain failures, particularly those involving program execution and timing, result in failures in which pulses continue to be transmitted to the watchdog port, although it is highly unlikely that these pulses will be transmitted at the prescribed normal operating frequency.

The present invention provides a watchdog circuit which is connected to the watchdog port of the microcontroller and which transmits an enable signal to the solenoid drive circuits which are responsive to the output signals from the microcontroller. The drive circuits, and thereby the solenoids, are enabled only when the enable signal is transmitted from the watchdog circuit, and the enable signal is transmitted by the watchdog circuit only when the pulses at the watchdog port of the microcontroller are within a predetermined, relatively narrow frequency range about the standard operating frequency of pulses at the watchdog port. Accordingly, the present invention has the advantage of detecting failures of program execution by the microcontroller which may affect control of the solenoids, but which causes the microcontroller to fail in such a way that pulses are still transmitted to the watchdog port. Accordingly, the present invention assures that, except in the extremely unlikely chance that the microcontroller will fail with the watchdog pulses at the prescribed frequency, the solenoid valves will not be actuated during failure of the microcontroller or of any other component in the system.

These and other advantages of the present invention will become apparent from the following description, with reference to the accompanying drawings, in which.

Figure 1:
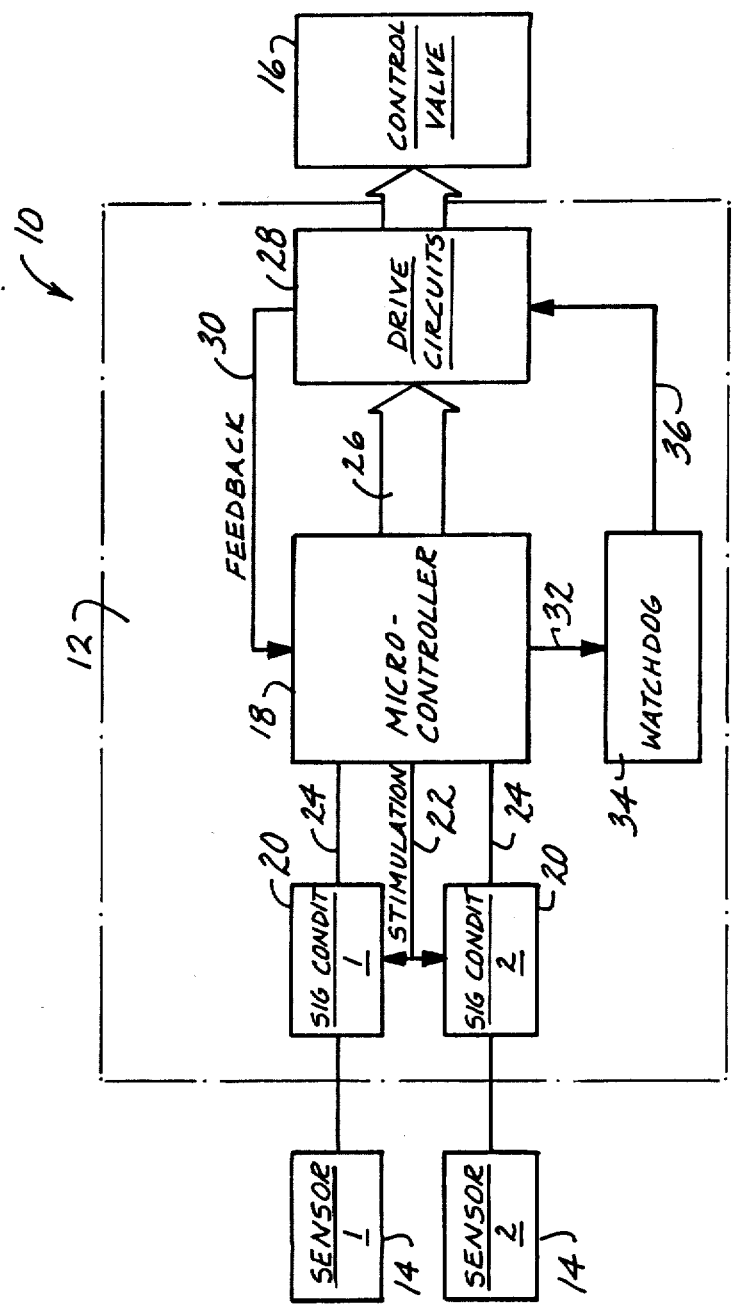
FIG. 1 is a system schematic of a vehicle control system made pursuant to the present invention.

Referring now to the drawings, a vehicle adaptive braking system is indicated schematically by the numeral 10. The adaptive braking system 10 includes an electronic control unit generally indicated by the numeral 12 which receives input signals from wheel speed senors 14 (only two of which are being shown, but any number may be used) and transmits control signals which actuates solenoids (not shown) on control valve 16. Control valve 16 controls fluid communication to the brakes of the vehicle, to thereby control braking pressure.

The electronic control unit 12 includes a microcontroller generally indicated by the numeral 18 which is programmed to generate signals controlling the control valve 16 in response to input signals received from the sensors 14. Electronic control unit 12 further includes signal conditioning circuitry 20 which receives signals from the speed sensors 14 and transmits them to the microcontroller 18. The signal conditioning circuits 20 includes self-test circuitry which tests for correct operation of the signal conditioning circuit 20 and also checks that the sensors 14 are not disconnected or short-circuited. The microcontroller initiates the self-check circuits of the signal conditioning circuitry 20 upon system power-up by generating a control signal through output line 22, which connects the microcontroller with the conditioning circuits 20. The microcontroller 18 actuates the self-check circuits and looks for appropriate responses back through the normal signal paths indicated by lines 24 on FIG. 1. The microcontroller 18, in response to the signals received from sensors 14, generates output signals which are transmitted by output bus 26 to solenoid drive circuit 28, which drives the electrically actuated solenoids contained within the control valve 16. The microcontroller 18 monitors operation of the drive circuit 28 through a feedback loop 30, which is used by the microcontroller 18 to verify that the control commands transmitted through bus 26 are correctly implemented by the drive circuit 28. The microcontroller 18, in a manner known to those skilled in the art, can also determine if the solenoids within the control valve 16 have a short or open circuit by interpreting the feedback response received through feedback line 30.

The microcontroller 18 is also capable of checking itself. Internal programs within the microcontroller 18 verify that all program memory is operable and also verifies random access memory (RAM) by writing and reading various bit patterns to and from the RAM. Test routines also verify data instruction decoding logic within the microcontroller 18. The various input/output ports are checked as part of the sensor and signal conditioning 20 and drive circuit 28 tests. Stimuli for these tests are transmitted from the microcontroller and the appropriate responses are returned as described above. Assuming that everything is operating properly, the microcontroller program is arranged to toggle a watchdog output line generally indicated by the numeral 32 at a predetermined rate. The pulsed output signal at a predetermined frequency transmitted through output line 32 is received by a watchdog circuit indicated at 34, which will be described hereinafter. The watchdog circuit 34 generates an enable signal which is transmitted to the drive circuit 28 through circuit path 36. The drive circuit 28 includes logic, such as a simple "AND" gate, and assures the aforementioned solenoid valves will be actuated only when signals are simultaneously received both through the output bus 26 and from the solenoid enable line 36.

Figure 2:
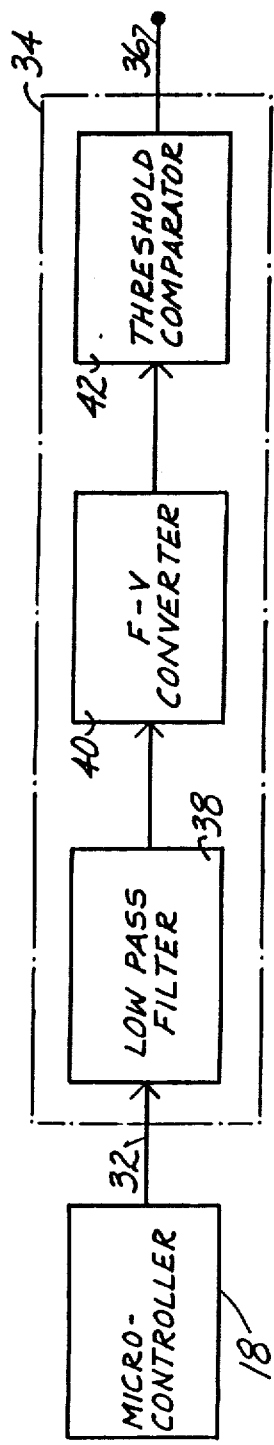
FIG. 2 is a system diagram of the watchdog circuit which provides an important component of the present invention.

Referring now to FIG. 2, the watchdog circuit 34 includes a low pass filter 38 connected to the watchdog output line 32. The output of filter 38 is connected to the input of a conventional frequency-to-voltage converter 40. The output of the frequency of the voltage converter 40 is connected to a threshold comparator 42, the output of which is transmitted through solenoid enable line 36 to the drive circuit 28. The low pass filter 38 passes signals to the frequency-to-voltage converter 40 only if the frequency of the signal being transmitted is less than the limit of the low pass filter 38. The frequency-to-voltage converter 40 converts the signal, if any, transmitted from the low pass filter 38 into an output signal which varies as a direct function of the frequency of the input signal to voltage converter 40. The output of the frequency-to-voltage convert 40 is compared with a predetermined reference level by threshold comparator 42, and an output signal is generated on solenoid enable line 36 only if the level of the signal generated by the frequency-to-voltage converter 40 is above the predetermine reference level. Accordingly, a signal is generated on solenoid enable line 36 only if the frequency of the signal on line 32 is within a relatively narrow range centered about the predetermined frequency. Frequencies above the predetermined frequency range are screened out by the low pass filter 38. Signals below the predetermined frequency level, when converted to an output signal by the frequency-to-voltage converter 40, will be less than the predetermined threshold level when compared in the threshold comparator 42.

Figure 3:
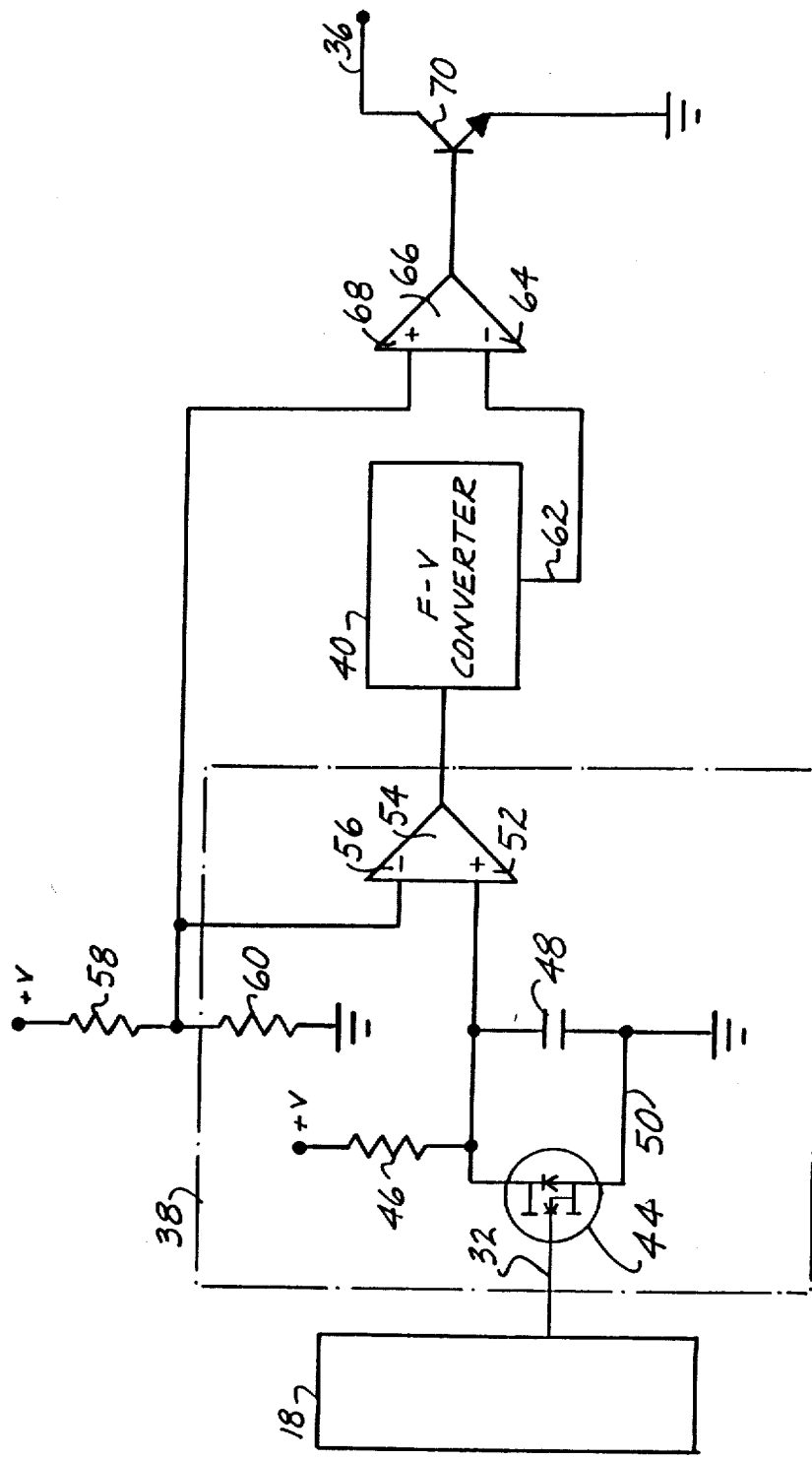
FIG. 3 is a detailed electrical schematic of the watchdog control circuit.

Referring now to FIG. 3, the low pass filter 38 includes a field effect transistor 44 which is switched by the pulsating signal on the line 32 from microcontroller 18 so that when the line 32 goes high the signal is transmitted to a RC circuit comprising resistor 46 capacitor 48. Accordingly, when the output line 32 goes low, the capacitor 48 is charged at a predetermined rate established by the values of the resistor 46 and the capacitor 48. However, when the output on line 32 goes high, the capacitor 48 is immediately drained to ground through grounding line 50. The capacitor 48 is connected to the positive input 52 of a comparator 54, the other terminal 56 of which is connected to a predetermined value established by voltage dividing resistors 58, 60. Accordingly, when the value at terminal 52 exceeds the value at terminal 56, comparator 54 turns on to transmit a signal to the input of frequency-to-voltage converter 40. It will, accordingly, be noted that at sufficiently high frequencies, capacitor 48 will never be charged sufficiently to exceed the value on terminal 56. Accordingly, comparator 54 will only pass a signal to the frequency-to-voltage converter 40 if the frequency of the signal on input line 32 is sufficiently low that the capacitor 48 has a chance to charge to a value that exceeds the value on terminal 56 before the signal on line 32 goes high. The frequency-to-voltage converter 40 generates a signal on output 62 which is a function of the frequency of the signal transmitted by the comparator 54. This signal is connected to the inverting terminal 64 of another voltage comparator 66, the other terminal 68 of which is connected to the voltage dividing resistors 58, 60. Accordingly, when the value at terminal 64 increases above the value at terminal 68 in an amount sufficient to cause the comparator 66 to change states, the output transistor 70 will be turned off, the signal on line 36 goes high thereby generating a solenoid enable signal on output line 36. If the signal at output 62 of frequency-to-voltage converter 40 is less than the value at terminal 68 of comparator 66, the transistor 70 will be turned on, thereby turning off the solenoid enable signal on line 36. As discussed above, the drive circuit 28 requires an input on the solenoid enable line 36 in order to actuate the solenoid valves contained within control valve 16.

Figure 4:
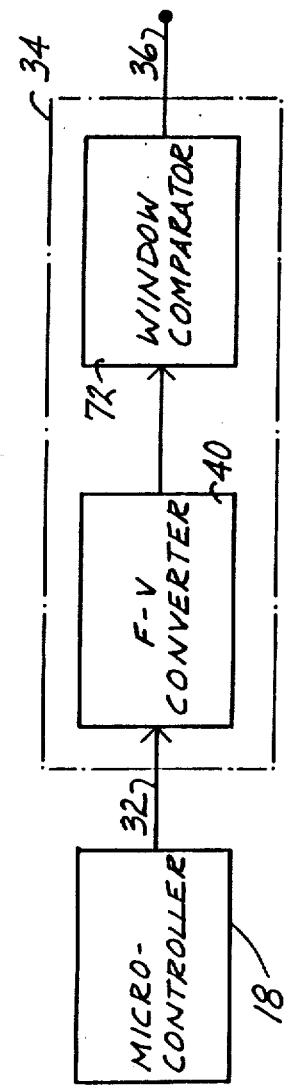
FIG. 4 is a diagrammatic illustration of an alternate embodiment of the the watchdog circuit used in the present invention.

Referring to FIG. 4, a modified embodiment of the watchdog circuit 34 is disclosed. In this embodiment, a window comparator 72, of conventional design, switches in response to the output of the frequency-to-voltage converter 40 so that an output is present on solenoid enable line 36 only if the output of the frequency-to-voltage converter 40 is within predetermined limits. Since the pulsed signal on the watchdog line 32 is converted to a signal which varies as a function of the frequency by frequency-to-voltage converter 40, the window comparator 72 will generate a signal on line 36 only if the frequency of the signal on line 32 is within predetermined limits.

I claim:

1. Control system comprising a microcontroller, means for transmitting input signals to said microcontroller, means for transmitting output signals from said microcontroller, said microcontroller including means responsive to said input signals for generating said output signals and further including a watchdog port from which a pulsating signal within a predetermined frequency range is transmitted during normal operation of the microcontroller, output signal responsive control means responsive to said output signals, interface means responsive to said output signals and to an enabling signal for normally permitting operation of the control means in response to said output signal but inhibiting said control means even if said output signals are received in the absence of said enabling signal, and enabling signal generating means responsive to said pulsed signal for generating said enabling signal when the frequency of said pulsed signal is within said predetermined frequency range and for removing said enabling signal even if a pulsed signal is present at the watchdog port if the frequency of said pulsed signal is outside of said predetermined frequency range.

2. Control system as claimed in claim 1, wherein said enabling signal generating means includes a frequency-to-voltage converter responsive to said pulsating signal for converting the latter to an output signal that varies as a function of the frequency of the pulsating signal, and comparison means for generating said enabling signal when said output signal is in a predetermined relationship with at least one reference level.

3. Control system as claimed in claim 2, wherein said comparison means is a window comparator, said window comparator generating said enabling signal when said output signal is below a first predetermined reference level and is above a second predetermined reference level.

4. Control system as claimed in claim 2, wherein said enabling signal generating means includes a filter connected to the input of the frequency-to-voltage converter for preventing transmission of said pulsating signal to the frequency-to-voltage converter when the frequency of the pulsating signal is in a predetermined relationship with said predetermined frequency range.

5. Control system as claimed in claim 4, wherein said comparison means compares said output signal to a single predetermined reference level, and generates said enabling signal only when said output signal is in a predetermined relationship with said single predetermined reference level.

6. Control system as claimed in claim 4, wherein said filter is a low pass filter which transmits said pulsating signal to said frequency-to-voltage converter only if the frequency of said pulsating signal is below a predetermined frequency.

7. Control system as claimed in claim 6, wherein said comparison means generates said enabling signal only when the output signal is above the predetermined reference level.

8. Control system as claimed in claim 2, wherein said comparison means compares said output signal to a predetermined reference level, and generates said enabling signal only when said output signal is in a predetermined relationship with said predetermined reference level.

9. Control system as claimed in claim 1, wherein said control system is a component of a vehicle brake control system for an automotive vehicle having wheels, fluid pressure operated brakes for controlling said wheels, and a source of fluid pressure for operating said brakes, said control means being electrically controlled valves for controlling communication between said brakes and said source of fluid pressure, said means for transmitting input signals including wheel speed sensing means responsive to rotation of at least one of said wheels for generating a signal which varies as a function of the speed of at least one of said wheels.

10. Control system as claimed in claim 9, wherein said enabling signal generating means includes a frequency-to-voltage converter responsive to said pulsating signal for converting the latter to an output signal that varies as a function of the frequency of the pulsating signal, and comparison means for generating said enabling signal when said output signal is in a predetermined relationship with at least one reference level.

11. Control system as claimed in claim 10, wherein said comparison means is a window comparator, said window comparator generating said enabling signal when said output signal is a below a first predetermined reference level and is above a second predetermined reference level.

12. Control system as claimed in claim 10, wherein said enabling signal generating means includes a filter connected to the input of the frequency-to-voltage converter for preventing transmission of said pulsating signal to the frequency-to-voltage converter when the frequency of the pulsating signal is in a predetermined relationship with said predetermined frequency range.

13. Control system as claimed in claim 12, wherein said comparison means compares said output signal to a predetermined reference level, and generates said enabling signal only when said output signal is in a predetermined relationship with said predetermined reference level.

14. Control system as claimed in claim 12, wherein said filter is a low pass filter which transmits said pulsating signal to said frequency-to-voltage converter only if the frequency of said pulsating signal is below a predetermined frequency.

15. Control system as claimed in claim 14, wherein said comparison means generates said enabling signal only when the output signal is above the predetermined reference level.

16. Control system as claimed in claim 10, wherein said comparison means compares said output signal to a predetermined reference level, and generates said enabling signal only when said output signal is in a predetermined relationship with said predetermined reference level.

* * * * *